United States Patent [19]

Mobbs et al.

[11] Patent Number: 4,636,913
[45] Date of Patent: Jan. 13, 1987

[54] TEMPERATURE COMPENSATED CAPACITOR

[75] Inventors: Christopher I. Mobbs; J. David Rhodes, both of Shipley, United Kingdom

[73] Assignee: Filtronic Components Limited, Shipley, United Kingdom

[21] Appl. No.: 798,740

[22] Filed: Nov. 15, 1985

Related U.S. Application Data

[62] Division of Ser. No. 605,383, Apr. 30, 1984, Pat. No. 4,581,795.

[51] Int. Cl.⁴ ............................................. H01H 47/18
[52] U.S. Cl. .................................................... 361/182
[58] Field of Search ............... 29/25.42; 361/182, 301, 361/323, 324, 321

[56] References Cited

U.S. PATENT DOCUMENTS

| | | | |
|---|---|---|---|
| 2,392,389 | 1/1946 | Joyce | 361/323 X |
| 2,854,606 | 9/1958 | Spiegel | 361/182 X |
| 2,930,714 | 3/1960 | Netherwood | 361/323 X |
| 4,109,456 | 8/1978 | Yamada et al. | 361/301 X |

FOREIGN PATENT DOCUMENTS

| | | |
|---|---|---|
| 230978 | 3/1925 | United Kingdom . |
| 507596 | 6/1939 | United Kingdom . |
| 639509 | 6/1950 | United Kingdom . |
| 720514 | 12/1954 | United Kingdom . |
| 781763 | 8/1957 | United Kingdom . |
| 798735 | 7/1958 | United Kingdom . |
| 1077953 | 8/1967 | United Kingdom . |
| 598817 | 2/1984 | United Kingdom . |

*Primary Examiner*—Donald A. Griffin

[57] ABSTRACT

A temperature compensating capacitor device is described. The device incorporates at least two capacitors with different dielectric materials which vary with temperature such that the overall capacitance of the device remains substantially constant. Filter circuits incorporating such devices and methods of making them are described. Capacitors of one dielectric material are formed by etching a conductive coating on one face of a layer of that material. The layer is attached via a conductive coating on its other face to the base of a housing, and capacitors of the other dielectric material are attached to its etched face. Other impedances are attached between the capacitors to form the ladder network.

9 Claims, 18 Drawing Figures

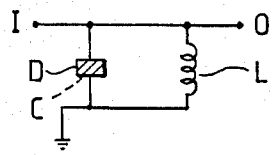
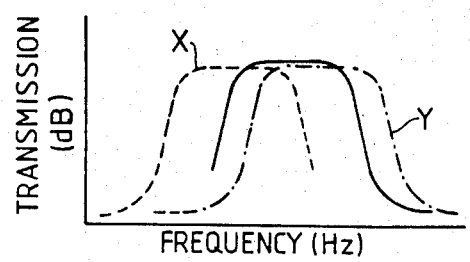
Fig.1.    Fig.2.
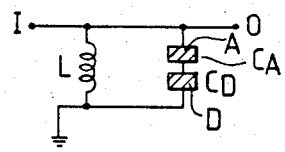
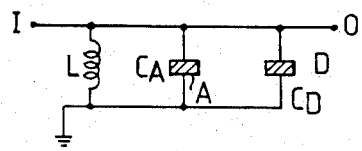
Fig.3.    Fig.4.
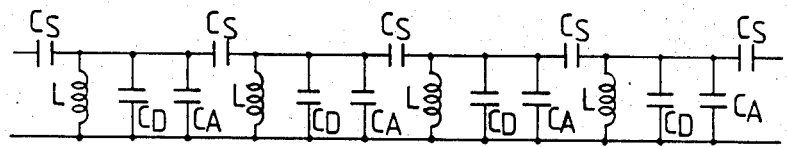
Fig.5.
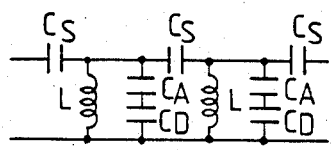
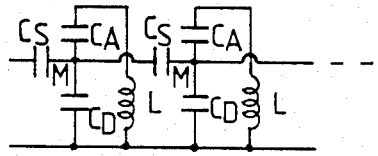
Fig.6.    Fig.7.
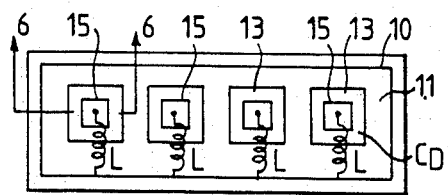
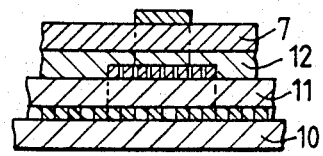
Fig.8.    Fig.10.
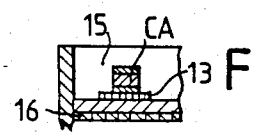
Fig.9.

TEMPERATURE COMPENSATED CAPACITOR

This application is a division of application Ser. No. 605,383 filed Apr. 30, 1984 and now U.S. Pat. No. 4,581,795 issued Apr. 15, 1986.

FIELD OF THE INVENTION

The present invention relates to temperature compensating capacitor devices and to the use of such capacitor devices in filter circuits for attenuating or suppressing the amplitude of an electronic signal over a specified frequency range. The present invention further relates to methods of manufacturing such circuits.

DESCRIPTION OF THE PRIOR ART

The capacitance of a capacitor generally changes with temperature as a result of changes in the dielectric constant and thermal expansion or contraction of the capacitor plates and the dielectric material between the plates.

When capacitors are used as one of the impedance devices in filter circuits to attenuate or suppress the amplitude of an electronic signal over a specified frequency range, the performance of the circuit will be dependent on the capacitance. Thus a change in capacitance with temperature will produce a change in the performance, or "frequency response", of the circuit. Especially when the circuit is a band pass filter, which allows only a limited band of frequencies to pass through the filter and reflects all other frequencies, any drift in the frequency band as a result of changes in temperature is highly undesirable.

This effect is particularly undesirable in narrow band filters where, for a broad input spectrum the output is a very narrow band of frequencies or a spike, since the spike will be shifted by changes in temperature. In microwave filter applications it is often a necessity that the frequency drift with temperature of a narrow band filter in the temperature range $-55°$ C. to $+125°$ C. to considerably less than 1%. This standard has been realized in the past by using physically large structures manufactured from temperature stable metals. This makes such filter circuits relatively expensive and difficult to manufacture.

SUMMARY OF THE INVENTION

It is a primary object of the invention to provide a capacitor device which is inherently temperature compensating.

It is a further object of the invention to provide such a capacitor device which is particularly suitable for use in filter circuits for modifying electronic signals.

According to the present invention a capacitor device is provided which incorporates at least two different dielectric materials chosen such that one of the materials, if used alone, would cause an increase in capacitance with temperature, and the other material, if used alone, would cause a decrease in capacitance with temperature, the combination being arranged so as to minimize changes in capacitance with temperature.

Preferably, the capacitor device comprises at least two capacitors with different dielectric materials between their plates, the capacitors being arranged such that, with increasing temperature, the capacitance of a first one of said capacitors decreases and the capacitance of a second one of said capacitors increases.

The capacitors may be arranged in series or in parallel. The capacitors may, in one arrangement, be positioned back-to-back.

Where two capacitors having capacitances $C_1$ and $C_2$ at ambient temperature, are arranged in parallel, the total capacitance C at ambient temperature is given by:

$$C = C_1 + C_2 \qquad (1)$$

If the temperature increases by t over ambient temperature, the change in capacitance will be given by:

$$C + \Delta C = C_1(1 - \delta_1 t) + C_2(1 + \delta_2 t) \qquad (2)$$

where $\Delta C$ is the change in capacitance and $-\delta_1$ and $\delta_2$ are temperature drift factors for the two capacitances. (Since the factor for the first capacitance is negative, that capacitance will decrease with increasing temperature). Thus, $$C + \Delta C = C_1 + C_2 + (-C_1\delta_1 + C_2\delta_2)t$$

substituting from equation (1), we get:

$$\Delta C = (-C_1\delta_1 + C_2\delta_2)t.$$

For an ideal case, $\Delta C$ must be as close to zero as possible. This will be achieved when $$C_1\delta_1 = C_2\delta_2$$

Thus the ratio of the two capacitances, if they are arranged in parallel, should be $$\frac{C_1}{C_2} = \frac{\delta_2}{\delta_1} \qquad (3)$$

A similar ratio can be determined when the capacitors are arranged in series, the capacitance C at ambient temperature then being given by $$C = \frac{C_1 \times C_2}{C_1 + C_2}$$

The resulting relationship between the capacitances and their temperature drift factors is given by:

$$C_1/C_2 = \delta_1/\delta_2 \qquad (4)$$

Thus the dimensions and dielectric materials of the two capacitors can be chosen so as to satisfy the desired relationship given in equation (3) or equation (4), since the capacitance $C_N$ of any capacitor is given by $$C_N = \frac{\epsilon_0 \epsilon_r A}{d} \qquad (5)$$

Where $\epsilon_0$ is the dielectric constant of air at ambient temperature, $\epsilon_r$ is the relative dielectric constant of the specific dielectric material N, A is the area of the dielectric plates and d is the separation between the plates.

The capacitor device may be used with an inductor in a filter circuit for selectively limiting an input signal, for example a band pass filter. This will substantially reduce drift in the frequency response with temperature, since in a capacitor, inductor resonator the resonant frequency $f_o$ is given by $$f_o = \frac{1}{2\pi \sqrt{L \times C}}$$

where C is the capacitance and L is the inductance in the circuit. If C remains substantially constant with temperature, the resonant frequency is also maintained relatively constant with temperature provided the inductance remains constant.

In one embodiment of the invention a band pass filter circuit incorporates the capacitor device described above in which the first one of the capacitors uses Duroid TM (Registered Trade Mark) as its dielectric material and the second capacitor uses alumina (Aluminum Oxide) as its dielectric material. The temperature drift factor, or $\delta_1$, of a Duriod is +150 PPM/°C. The temperature drift factor, or $\delta_2$, of alumina is −70 PPM/°C. Referring to equation (4) above, if the capacitors $C_1$ and $C_2$ are arranged in series the ratio of their capacitances should be chosen such that $$\frac{C_1}{C_2} = \frac{150}{70}$$

or $C_1 = 2.1$ $C_2$, where $C_1$ is duroid and $C_2$ is alumina. This ratio can be achieved by suitable selection of the capacitor plate areas and separation, using equation (5) above. Similarly, if the capacitors are arranged in parallel the capacitances should be chosen such that the relationship is $$C_2 = 2.1 \, C_1$$

Clearly, different dielectric materials with similar characteristics could be chosen to achieve the same temperature compensating result.

In most practical filter circuits a series of circuit sections are connected together to form a ladder-type filter. According to another embodiment of the present invention a series of circuit sections each comprising a combination of impedances are connected together as a ladder type filter, one of the impedances in each section comprising the temperature compensating capacitor device described above. The capacitor device may comprise capacitors arranged in series or in parallel, with suitable choice of the capacitances.

Adjacent section are coupled together by other circuit elements such as capacitors. If the capacitors of the temperature compensating filter device are connected in series and the coupling connection is made through a capacitor connected between the midpoints of the capacitors in adjacent sections, the coupling capacitance values can be larger. This makes the coupling capacitors easier to make since the tolerances are less critical.

Band pass filter circuits including such temperature compensating capacitor devices are particularly useful in high frequency applications in the 70 MHz to 18 GHz range (VHF, UHF and microwaves), where even a small temperature drift can create significant effects. Thus in these applications it is normally a requirement that the frequency drift is less than 10 PPM/°C. in the temperature range −55° C. to +125° C. By using temperature compensating capacitor devices according to the present invention in such filter circuits this standard can be achieved without the use of expensive materials and complicated structures.

According to a further feature of the invention, where several sections are connected to form a ladder-type filter, the end sections of the filter may be inductively cross coupled together to produce a so-called quasi-elliptic frequency response. For a given number of sections, this type of response is closer to the ideal rectangular frequency response for a band pass filter. It can also result in better amplitude and phase equalization, which is particularly useful in microwave filters where phase variation is a problem.

A further object of the invention is to provide a filter circuit which is relatively easy to manufacture.

According to another aspect of the present invention, a ladder-type filter circuit is made by taking a sheet of a first dielectric material having conductive coatings on both faces, etching the conductive coating on one face to define a first set of capacitors between opposed conductive areas on the opposite faces of the sheet, attaching the sheet at its unetched face to the base of a conductive housing, attaching a second set of capacitors of a second, different dielectric material to the first set, and connecting inductors to the capacitors. The connections are arranged to form a ladder-type circuit of adjacent circuit sections, each section comprising an impedance and at least one capacitor each of the first and second sets.

Where alumina is used as the second dielectric material and the first dielectric material is a flexible material such as Duroid, this construction allows the first dielectric layer to cushion the more brittle alumina capacitors from the effects of the thermal expansion and contraction of the housing during manufacture. Such housings are typically made of easily machinable materials, such as brass or aluminum, which have high coefficients of thermal expansion. If alumina capacitors are soldered directly to the housing, expansion of the housing may cause them to crack and break up. Thus in prior art arrangements an intermediate layer was necessary between the alumina and the housing to prevent damage during manufacture and use under extreme temperature.

In the preferred present arrangement a flexible layer of the first Duroid capacitor itself acts as a cushioning layer between the housing and the second alumina capacitor. According to a further preferred feature of the invention, the second capacitor may be formed by etching conductive coatings on opposite sides of a sheet of the second dielectric material to form opposed conductive areas defining the capacitor. The first material layer can then be attached to the housing by soldering and the second material layer can also be attached to the first material layer by soldering. This construction allows woth capacitors to be formed by photoetching layers of the different dielectric materials, which is easier and more accurate than laser or diamond saw cutting. This is particularly useful for filters in the 70 MHz to 18 GHz range, where the physical dimensions of the circuit components must be relatively small. The arrangement allows photoetching of a coated alumina layer to form one set of capacitors where the other set is formed in a coated flexible material layer which acts as a buffer absorbing any thermal expansion or contraction of the housing to protect the alumina layer from damage. In the prior art alumina capacitors formed by photoetching could only be used if a carrier layer was positioned between the etched alumina layer and the housing.

BRIEF DESCRIPTION OF THE DRAWINGS

The following is a brief description of the accompanying drawings.

FIG. 1 shows part of a typical prior art filter circuit.

FIG. 2 shows typical band pass frequency response curves of a filter circuit showing frequency drift with temperature.

FIG. 3 shows a temperature compensating capacitor device according to one embodiment of the present invention where two capacitors are connected in series, resonated with an inductor to form a filter circuit section.

FIG. 4 shows a parallel arrangement of the capacitors in another embodiment of a filter circuit section.

FIG. 5 shows a ladder-type filter circuit incorporating several of the circuit sections of FIG. 4, according to an embodiment of the invention.

FIG. 6 shows anaother ladder-type filter circuit according to the invention.

FIG. 7 shows another arrangement for a ladder-type filter circuit according to the invention.

FIG. 8 is a top plan view of the shunt resonators of a filter circuit construction according to the invention.

FIG. 9 is a cross section on the line 6—6 of FIG. 8.

FIG. 10 is a cross section similar to FIG. 9 showing an alternative construction where both duroid and alumina capacitors are produced by photo-etching.

DETAILED DESCRIPTION OF THE PREFERRED EMBODIMENT

Figure 11:
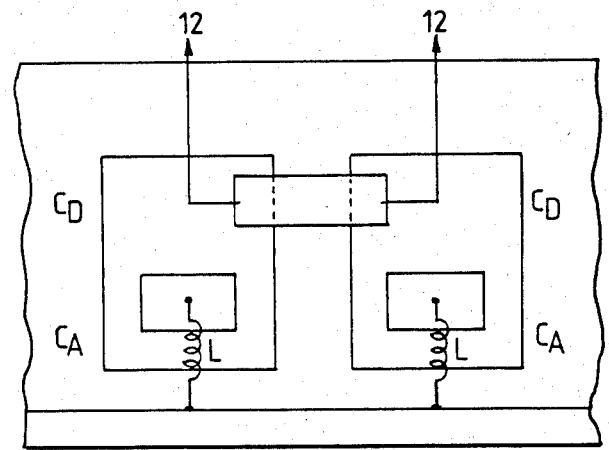
FIG. 11 is a top plan view of an alternative filter circuit construction according to the invention.

FIG. 1 shows part of a filter circuit comprising a capacitor C and an inductor L connected between input I and output O. The ciruit comprises a band pass type filter having a frequency response, of the type shown in solid outline in FIG. 2. Thus the amplitude of the output is suppressed or attenuated at all frequencies except for a limited band of frequencies between the so-called cut-off frequencies. The cut-off frequencies are dependent on the value of inductance L and capacitance C, and thus if the capacitance changes with temperature the cut-off frequencies will change.

A capacitor of the type shown in FIG. 1 will have a frequency drift with temperature which is dependent on the dielectric material, D, used and the dimensions of the capacitor. This drift results from changes in the dielectric constant of the material as well as thermal expansions or contractions with temperature, all of which will change the capacitance. The dotted line response curves shown in FIG. 2 represent a typical frequency response at different temperatures above Y and below X ambient temperature and the solid line shows the frequency response at ambient temperature.

FIGS. 3 and 4 show temperature compensating capacitor devices according to the invention which have a reduced temperature drift. The devices are connected in filter circuit sections with inductor L. Each capacitor device comprises a first capacitor $C_D$ of one dielectric material D, and a second capacitor $C_A$ of another dielectric material A. In FIG. 3 the capacitors $C_A$ and $C_D$ are connected in series and in FIG. 4 the capacitors $C_A$ and $C_D$ are connected in parallel. The series arrangement of FIG. 3 is useful for high frequency filters as it enables physically larger capacitors, which are easier to manufacture, to be used.

The capacitors $C_A$ and $C_D$ are chosen such that the overall capacitance of the circuit remains substantially constant with temperature changes. This is achieved by suitable choice of the dielectric materials and dimensions of the capacitors.

In a preferred embodiment of the invention the dielectric material of the first capacitor $C_D$ is Duroid TM 5880 or 6010.5 and the dielectric material of the second capacitor $C_A$ is alumina.

Duroid TM 5880 is a PTFE/teflon based material and a dielectric layer of this material will have fibers running in the X and Y longitudinal directions but none in the transverse Z, or thickness, direction. Thus when the temperature increases, expansion in the Z direction will be to a greater degree than expansions in the X and Y, or area, directions. Referring to equation (5) above, it can be seen that if d increases at a faster rate than A the capacitance will decrease. In an alumina capacitor which has a uniform dielectric, the opposite effect will occur, and the capacitance increases with increasing temperature.

It has been found that, as a result of these effects and the changes in dielectric constants with temperature, a filter in the form of FIG. 1 having a Duroid TM capacitor would have a temperature drift factor of approximately +150 PPM/°C. An alumina capacitor in the circuit of FIG. 1 would have a temperature drift factor of approximately −70 PPM/°C.

A capacitance which produces a much more constant response with temperature can be produced by a combination of alumina and Duroid capacitors. In the arrangement of FIG. 4 the total capacitance C is given by $$C = C_A + C_D$$

If the temperature changes by t°C., then the change C in the total capacitance is given by $$C + \Delta C = C_A(1 - \delta_A t) + C_D(1 + \delta_D t)$$

where $\delta_A$ is a temperature drift factor for alumina which is approximately 70 PPM/°C., and $\delta_D$ is a temperature drift factor for Duroid which is approximately 150 PPM/°C. Substituting for C from the first equation gives $$\Delta C = (C_D \delta_D - C_A \delta_A)t.$$

To make $\Delta C$ as close to zero as possible, the capacitances should be arranged so that $$C_D \delta_D = C_A \delta_A$$

Substituting in for the drift factors, this gives $$C_A = 2.1\ C_D$$

Similar reasoning for the series arrangement of FIG. 3, where $$C = \frac{C_A \times C_D}{C_A + C_D}$$

gives the relationship $$C_D = 2.1\, C_A$$

These relationships can be achieved by the choice of suitable dimensions for the capacitor $C_A$ and $C_D$. Thus, for example, if the areas of the capacitor plates are the same, the desired ratio for the parallel arrangement can be achieved by having a thickness between the capacitor plates of approximately 0.005 inches for the Duroid ™ capacitor and of approximately 0.01 inches for the alumina capacitor, since the relative dielectric constant of alumina and Duroid ™ are 10 and 2.2, respectively.

Clearly, similar relationships can be calculated using other dielectric materials which together will produce substantially no change in capacitance with temperature.

With the Duroid/alumina arrangement described above, substantially small temperature drifts of substantially less than 10 PPM/°C. have been realized in the −55° C. to +125° C. temperature range. This is particulary beneficial in narrow band, high frequency filters. In this case small drifts in the frequency would have a significant effect. The series combination of FIG. 3 is the most useful arrangement for a high frequency filter of this type.

Several embodiments of filter circuits incorporating circuit sections as described above are shown in FIGS. 5, 6 and 7. In these circuits, several such circuit sections are connected together to form ladder networks.

In the sections of FIG. 5 capacitors $C_A$ and $C_D$ are coupled in parallel to provide a narrow band, filter. FIG. 6 shows a modification of the FIG. 5 arrangement, where $C_A$ and $C_O$ are connected in series and adjacent sections are coupled together by capacitors $C_S$. The coupling capacitors in this arrangement are usually very small, which can make their physical realization difficult, particularly when laser or diamond saw cutting techniques are used in their manufacture as the tolerances required are very severe.

FIG. 7 shows a further modification where this problem is reduced. In this embodiment the coupling capacitor $C_s$ is connected between the midpoints of capacitors $C_A$ and $C_D$ in adjacent sections. This allows the capacitors to be larger while still providing the desired reduction in temperature drift, and thus the manufacturing tolerances are reduced to values as much as ten times less critical than in the FIGS. 5 and 6 embodiments.

A method of constructing ladder network filters of the type shown in FIGS. 5, 6 and 7 will now be described with reference to FIGS. 8 and 9. The circuit sections are mounted in and connected to a housing 10 of conductive material such as brass or aluminum. Input and outlet terminations (not shown) for connection to suitable coaxial feeds will be provided at opposite ends of the housing and connected to opposite ends of the ladder network.

The capacitors $C_D$ are formed by etching one face of a layer 11 of the first dielectric material which is coated on both sides with conductive material 12. Capacitors $C_D$ are defined between areas 13 of conductive material left by the etching and the underlying areas of the unetched face of the conductive coating. In a preferred embodiment of the invention the dielectric material layer 11 is Duroid ™, which may be coated on both sides with copper, for example.

The layer 11 is attached to the base of housing 10, for example by soldering. The capacitors $C_A$ 15 may be formed by cutting out capacitors of suitable sizes with a laser or diamond saw from sheets of the material A having a conductive coating on both sides. In a preferred embodiment the material A is alumina and the conductive coating may, for example, be copper.

Capacitors $C_A$ 15 are soldered to respective conductive areas 13 of the upper face of layer 11, as shown in FIG. 9. The inductors L are then attached, for example by soldering, between capacitors $C_A$ 15 and the side walls of housing 10. Adjacent circuit sections in the ladder may be coupled together by attaching suitable coupling capacitors (not shown), such as leaf springs, between them.

Such filter circuits may be designed and manufactured to produce any desired frequency response, but they are particularly useful as filter circuits for the 70 MHz to 18 GHz frequency range. Although the specific materials used in the preferred embodiment have been described above, it will be understood that alternative materials having the desired characteristics may be used for the dielectric materials, conductive coatings and conductive housing. Thus the dielectric materials chosen must be such that in combination they produce the desired, substantially, constant capacitance and consequent reduction in temperature drift.

Figure 12:
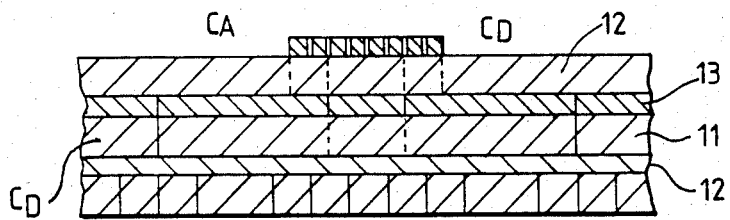
FIG. 12 is a cross section on the line 12—12 of FIG. 11.

FIGS. 10 to 12 illustrate a modified method of constructing ladder network filters according to the invention. As in the FIGS. 8 and 9 arrangement, the capacitors $C_D$ are formed by etching the upper face of a layer 11 of the material D, preferably Duroid, which is coated with conductive material, 12 suitably copper, on its opposite faces. Layer 11 is attached to the base of a housing 10, as in FIG. 8, with its etched face 14 uppermost.

Capacitors $C_A$ are formed by etching both upper and lower faces of a layer 17 of dielectric material A coated with conductive material. As in the previous embodiments material A is preferably alumina and the coating is preferably copper. Capacitors $C_A$ are defined between opposed areas of conductive material on opposite faces of layer 17. Layer 17 is then attached to layer 11, for example by soldering, so that capacitors $C_D$ contact capacitors $C_A$.

An advantage of this construction, in addition to the reduced temperature drift, is that it enables alumina capacitors to be manufactured by photoetching a conductively coated sheet of alumina and to be attached in a housing without any necessity for a carrier to protect the brittle alumina from thermal expansion and contraction stresses. In prior art arrangements where alumina capacitors were mounted in housings of materials having high coefficients of thermal expansion, carriers of Kovar (Registered Trade Mark) were used between the capacitors and the housing. The alumina capacitors could not be soldered directly to the housing as thermal expansion of the housing material could result in break up of the brittle alumina.

In the present arrangement the lower layer of Duroid capacitors itself acts to cushion the alumina from thermal expansion and contraction stresses, since duroid is a non-rigid somewhat flexible material which can absorb such expansions and contractions.

FIGS. 11 and 12 illustrate a coupling connection between adjacent sections of a ladder circuit constructed from two etched layers. The upper face of layer 15 is etched so as to form conductive bridge areas 16 between adjacent capacitors $C_A$. This effectively defines a pi network of linking capacitors $C_A$ and $C_{D/A}$ which is a combination of both dielectric materials D and A between each bridge area 16 and the underlying area of the lower conductive coating of layer 12.

Figure 13:
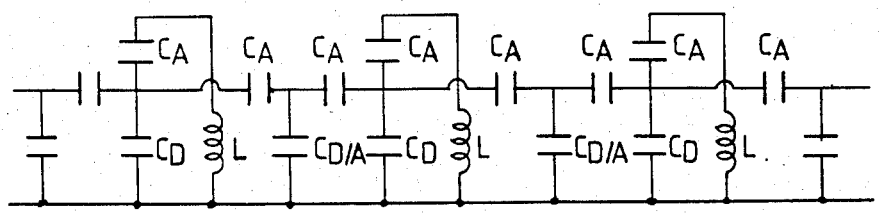
FIG. 13 shows another ladder-type filter circuit according to the invention.
Figure 13A:
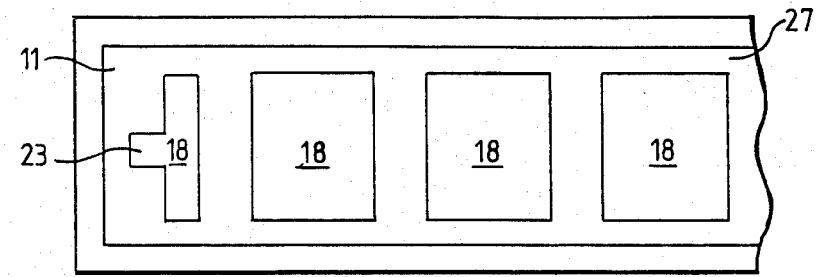
FIGS. 13A to 13B are plan views of different levels of a construction providing the circuit elements of FIG. 13.
Figure 13B:
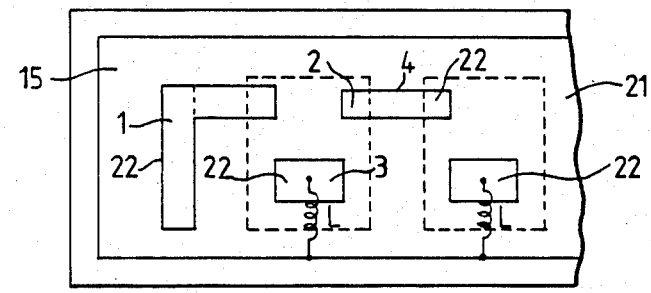

A ladder circuit which can be constructed in this way is shown in FIG. 13. FIGS. 13A and 13B show the etching of coated layers 11 and 15 to form the circuit of FIG. 13. FIG. 13A shows the etching of the top face 27 of layer 11, which is preferably a Duroid material layer, to form conductive areas 18. FIG. 13B shows the lower face of layer 17 is identical to the upper face of layer 11. FIG. 13C shows the etching of the upper face 21 of layer 15 to form conductive areas 22. When layer 15 is attached to layer 11, the two identical faces will engage and may be fastened together by reflow soldering.

The various capacitors of the circuit shown in FIG. 13 are defined by the overlap between the various etched conductive areas. The capacitors $C_A$ labeled 1, 2 and 3 in FIG. 13 are defined between the conductive areas labeled 1, 2 and 3 on the opposing faces of layer 17, as shown in FIGS. 13A and 13B. The linking capacitors between adjacent sections of the ladder network are formed by conductive bridge area 4 on the upper face 21 of layer 17 (see FIG. 13C), in the manner described above in connection with FIGS. 11 and 12. Inductors L are soldered between the capacitors $C_A$ numbered 3 in the drawings, and the side wall of the housing. FIG. 13A shows an input pin 23 which is attached to the first conductive area 18 on face 11.

The construction technique described above allows large ladder network filters including capacitors of different dielectric materials to be easily manufactured. The cost of manufacture is reduced over prior art arrangements, and it has been found that filter circuits of the described type can be made within limits not previously possible in equivalent single material capacitor filter circuits.

The ideal frequency response of a band pass filter is rectangular. In practice (see FIG. 2) the sides of the characteristic response will be sloping and the center portion will not be flat, due to the delay time of the filter being slightly different at different frequencies, combined with the fact that the elements in the filter are not entirely lossless. One way of improving the frequency response by steepening the slide slopes and flattening the top of the curve is to add more sections to the ladder network and widening the filter bandwidth. However this results in some signal losses. Another way of making the frequency response more "square" is to inductively cross-couple the end sections of a capacitively coupled ladder network to produce a so-called quasi-elliptic function filter.

Figure 14:
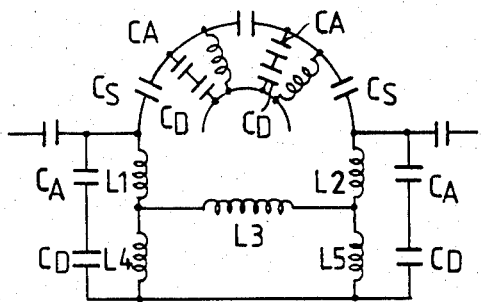
FIG. 14 shows another ladder-type filter circuit according to the invention.
Figure 15:
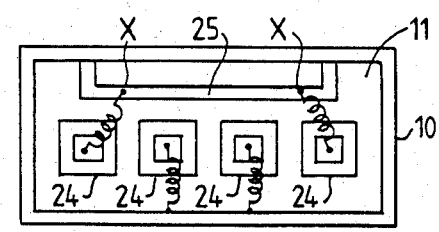
FIG. 15 is a top plan view of a construction providing the shunt circuit elements of FIG. 14.

FIG. 14 shows a circuit comprising a ladder network including filter sections having different material capacitors $C_A$ and $C_D$ as described above, and an inductive cross-coupling L1, L2, L3, L4, L5 between the end sections of the ladder network. A method of constructing the circuit of FIG. 14 can be seen in FIG. 15 which shows the series capacitors are realized using small coupling wires soldered to the shunt alumina capacitors at one end. As in the previous embodiments, capacitors $C_D$ are formed by etching one face of a layer 11 of dielectric material D, which is preferably Duroid, to form conductive areas 24. Layer 11 is additionally etched to form a copper coupling line 25. Alumina capacitors $C_A$, formed either separately as described in connection with FIGS. 8 and 9 or by etching a coated layer of alumina as described in connection with FIGS. 10 to 12 above, are attached to the Duroid layer.

The capacitors $C_A$ of the end sections of the ladder are attached by inductors L1 and L2 to intermediate points X on the coupling line 25. Effective inductor L3 is defined between points X on the coupling line, and effective inductors L4 and L5 are defined between the side walls of the housing and points X. Inductances L3, L4 and L5 formed by coupling line 25 are much smaller than helically wound inductances L1 and L2.

Figure 16:
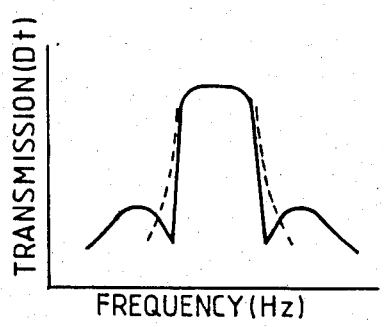
FIG. 16 is a frequency response curve for the circuit of FIG. 14.

The frequency response of such a quasi-elliptical function filter is shown in FIG. 16. If there is an even number of ladder sections between the cross-coupled end sections, there will be transmission zeros at each side of the passband. If there is an odd number of sections, there will be a transmission zero at the high side of the passband only.

By increasing the distance between points X, the response tends towards that of a chebyshev filter (when the arrangment is again effectively that of FIG. 8). The distance between points X can be adjusted before finally soldering inductors L1 and L2 in place, to provide an optimum frequency response.

The inductively cross-coupled circuit described above enables a ladder network with a lower number of sections to produce a specified frequency response. This results in a small size and less expensive filter, and a reduced loss of signal for the same frequency response. The frequency response will approximate more closely to the desired square function for a band pass filter, and an asymmetric response may be produced if desired by the provision of suitable numbers of filter sections. The cross-coupling can also result in substantial amplitude and phase equalization. This is particularly useful for many microwave filters, since such filters have problems of phase shift as a result of different frequencies passing through the filter with different delay times.

If the coefficient of thermal of expansion of area of the dielectric is $\alpha_A$, and that of its depth is $\alpha d$, then form equation (5) the capacitance varies as:

$$\frac{E r \alpha_A A}{\alpha_d d}$$

If $$\alpha d = E r \alpha_A$$

then the capacitance will remain constant with temperature, dielectric has such properties, but, in accordance with the invention, a suitably chosen composite of two or more dielectrics can approximate to the above.

We claim:

1. A filter circuit for producing a desired frequency response including a plurality of circuit sections connected together so as to form a ladder network, said circuit sections each comprising a combination of impedances including inductive impedances and capacitative impedances, said capacitative impedance including a capacitative device comprising at least two capacitors formed respectively from at least two different dielectric materials chosen such that one of said materials, if used alone, would cause an increase on capacitance with temperature, and the other material, if used alone, would cause a decrease in capacitance with temperature, the materials and dimensions of the said capacitors being structured such that, the capacitance of one decreases and the capacitance of the other increases, one of said dielectric materials comprising PTFE fibers and the other of said dielectric materials comprising a ceramic material.

2. The device of claim 1 wherein adjacent circuit sections are connected together by coupling capacitors.

3. The device of claim 1 wherein the first and last circuit sections of such ladder formation are inductively cross-coupled together to produce a quasi-eliptic frequency response.

4. The device of claim 1 wherein said capacitors of each section are connected in series across said impedance and adjacent circuit sections in said ladder formation are connected together between the mid points of the capacitors of said adjacent sections.

5. The device of claim 1 comprising a housing having a conductive inner face and a signal inlet and outlet, said sections being mounted in said housing between said inlet and said outlet, said first capacitors of said sections comprising a layer of said dielectric material having a coating of conductive material on one face which is attached to the base of said housing and a coating of etched conductive material on its other face, the areas of conductive material formed by the etching defining said first capacitor; said second capacitors being attached to said areas of conductive material and said impedances comprising inductors connected between said second capacitors and said housing inner wall.

6. The device of claim 5 wherein said etched face of said first dielectric material includes an etched conductive coupling line between different areas of said housing inner wall, the second capacitors of first and last sections of such ladder formation being connected by inductors to spaced points on said coupling line to form an inductive cross coupling.

7. The device of claim 5 wherein said second capacitors of said sections comprising a layer of said second dielectric material having a conductive coating on each face, said conductive coatings being etched to form opposed conductive areas between which said second capacitors are defined.

8. The device of claim 7 wherein adjacent sections are connected together by conductive areas on an upper face of said second dielectric material layer extending between areas defining adjacent second capacitors so as to define a capacitor connection between the lower face of said first dielectric material layer and said extended area of said upper face of said second dielectric material layer.

9. The device of claim 8 wherein said dielectric layers have conductive coatings of copper.

* * * * *